United States Patent [19]

Knapp

[11] Patent Number: 4,774,904
[45] Date of Patent: Oct. 4, 1988

[54] MULTIPLE-LAYER GROWTH OF PLURAL SEMICONDUCTOR DEVICES

[76] Inventor: Jamie Knapp, Beit Haarava 3/2, Talpiot, Jerusalem, Israel, 93 389

[21] Appl. No.: 912,730

[22] Filed: Sep. 29, 1986

[51] Int. Cl.⁴ ........................................... H01L 21/208
[52] U.S. Cl. ..................................... 118/58; 118/404; 118/412; 118/425
[58] Field of Search ................ 118/412, 425, 404, 58, 118/641; 156/622; 148/171, 172

[56] References Cited

U.S. PATENT DOCUMENTS

| | | | |
|---|---|---|---|
| 4,406,245 | 9/1983 | Heinen | 118/412 X |
| 4,592,304 | 6/1986 | Hager et al. | 118/412 X |

Primary Examiner—John P. McIntosh

[57] ABSTRACT

Horizontal slider for the fabrication of semiconductor devices employs a succession of reservoirs and wells for successive applications of material in the growing of multiple layer semiconductor devices. The apparatus is composed of three assemblies each of which is fabricated of graphite to avoid contamination of the semiconductor material. The apparatus is operated within a furnace wherein the temperature is varied between a relatively high temperature for providing saturated solutions, to a lower temperature during which epitaxial growth can occur, and ambient temperature for completion of a fabrication procedure. One of the assemblies contains a set of wells, a second assembly contains reservoirs and slides horizontally upon the assembly of wells for alternately communicating reservoirs with wells and terminating such communication for a filling of the wells with requisite melts. The third assembly is a set of bars having recesses for carrying substrates, the bars being slid through channels in walls of the first assembly to advance the substrate sequentially from well to well for simultaneous growth of layers upon a plurality of substrates.

10 Claims, 4 Drawing Sheets

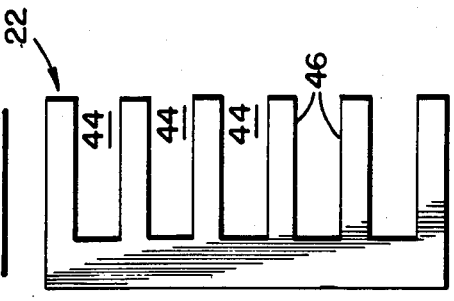
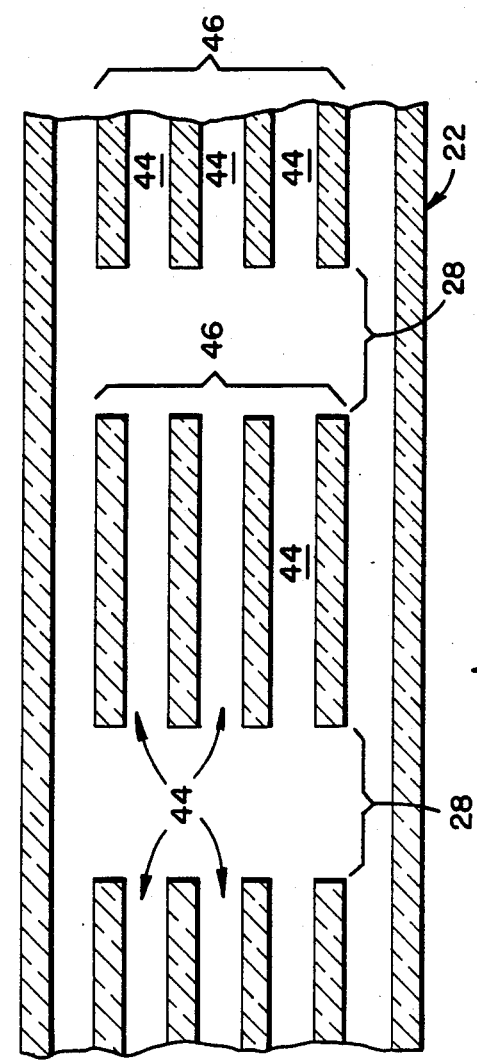
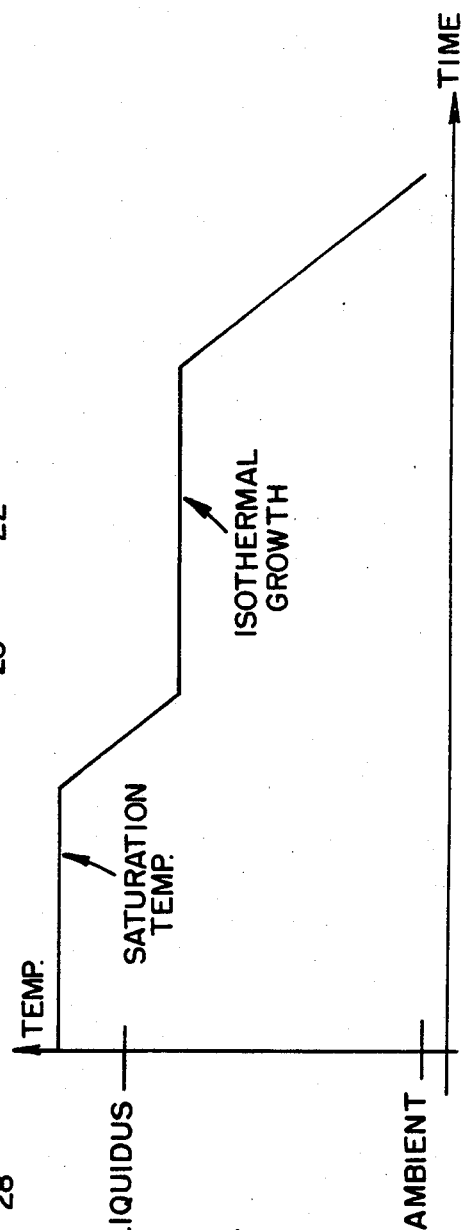

MULTIPLE-LAYER GROWTH OF PLURAL SEMICONDUCTOR DEVICES

BACKGROUND OF THE INVENTION

This invention relates to the simultaneous manufacture of multiple layer semiconductor devices including epitaxial growth of successive layers and and, more particularly, to the growth of mercury-cadmium-telluride detectors of infrared radiation.

Infrared detectors are frequently used for the sensing of infrared radiation. Arrays of such detectors are employed with electronic circuitry for developing images of sources of infrared radiation. Such detectors may be constructed of suitably doped layers of silicon as well as composite structures of cadmium telluride and HgCdTe plus other layers such as metallization and oxide passivation layers.

In view of the large demand for such devices, and in view of the desirability of maintaining uniform optical and electrical characteristics among the devices to be constructed, it is important to have manufacturing aids which facilitate the manufacture of the devices while maintaining quality control in the manufacturing process.

One such manufacturing aid, commonly known as a slider is described in U.S. Pat. No. 4,317,689 issued in the name of Bowers et al on Mar. 2, 1982. Therein, a sliding element having wells for the containment of liquified semiconductor material passes along a base having a recess for holding a substrate wafer upon which successive layers of semiconductor material are grown by liquid-phase epitaxy. The composite structure serves as a graphite furnace boat which holds the semiconductor materials within a furnace, such as a quartz tube surrounded by an electric heating coil.

Devices such as that disclosed in the foregoing patent are advantageous in the construction of semiconductor devices such as HgCdTe infrared detectors. However, a problem is found in that current manufacturing technology requires still further capabilities not provided by the foregoing slider structures. Such capabilities include provision for in-situ substrate etch, provision for successive growths of three or more epitaxial films from totally isolated melts, provision for buffer layer deposition, provision for interlayer in-situ anneals, provision for in-situ melt saturation with CdTe, ability to decant melt oxides, ability to grow layers on multiple (for example, eight or more) wafers simultaneously, and the provision of growth from a totally confined melt.

SUMMARY OF THE INVENTION

The foregoing problem is overcome and other advantages are provided by horizontal slider apparatus incorporating the invention for the formation, simultaneously, of multiple wafers wherein each wafer is a semiconductor device of multiple layers. It is an object of the invention to provide, when necessary, an in-situ substrate etch, successive growths of a plurality of epitaxial films, and other ones of the foregoing desired capabilities for manufacturing processes.

The slider apparatus of the invention comprises a fixed assembly of wells interconnected by a set of parallel channels which serve to transport a bank of slide bars. An assembly of melt reservoirs rides slideably on top of the well assembly for discharging liquid phase material into the wells after the material has been heated in a furnace to a suitable temperature for epitaxial growth of layers upon a substrate. Each of the bars contains one or more recesses for holding wafer substrates, and for transporting the substrates from one melt well to the next melt well for successive growing of epitaxial layers. The assembly of melt reservoirs is translated relative to the well assembly, after a filling of the melt wells, to close the melt wells so as to prevent contamination of the material within a melt well and to prevent evaporation of material from a melt well. While the apparatus is useful for a variety of semiconductor materials, the apparatus is particularly advantageous for the construction of photovoltaic detectors of mercury-cadmium-telluride.

BRIEF DESCRIPTION OF THE DRAWING

The foregoing aspects and other features of the invention are explained in the following description, taken in connection with the accompanying drawing wherein:

FIG. 5 is a plan view of a slide bar of the apparatus of FIG. 1, the slide bar having a single recess for holding a wafer substrate;

FIG. 6 is a longitudinal sectional view of the slide bar taken along the line 6—6 in FIG. 5, the view showing dual recesses for holding wafer substrates;

FIG. 7 is a longitudinal sectional view, corresponding to that of FIG. 6, for the case of a slide bar having a single recess for holding a wafer substrate;

FIG. 8 is a longitudinal sectional view of a portion of a melt well assembly taken along the line 8—8 in FIG. 2;

FIG. 9 is an end view of the melt well assembly of FIG. 8;

FIG. 11 is a graph of temperature versus time in an exemplary operational procedure in the fabrication of a semiconductor device.

DETAILED DESCRIPTION

Figure 1:
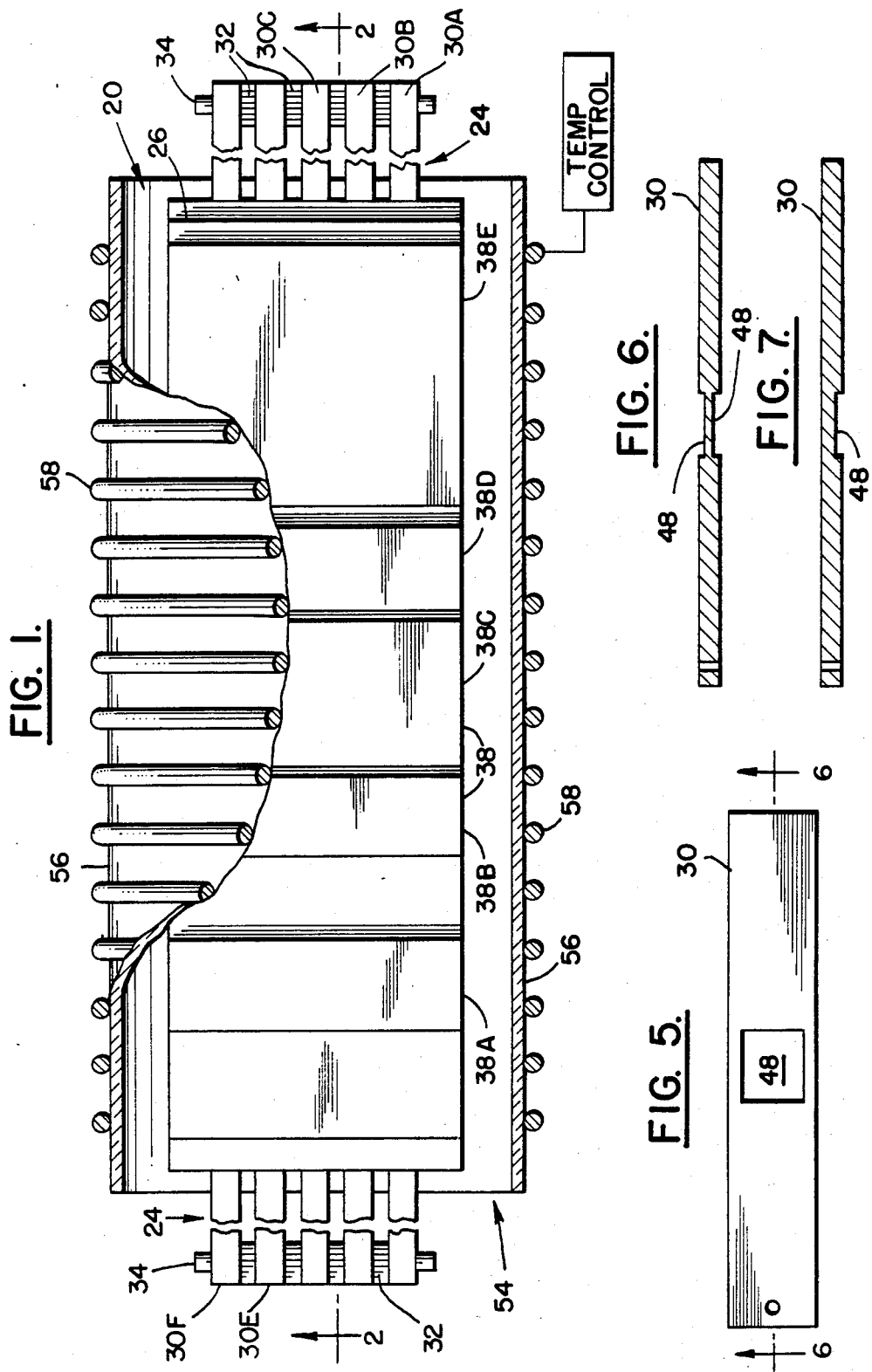
FIG. 1 is a plan view of horizontal slider apparatus incorporating the invention, the view also showing an electric furnace, partially cut away, for heating the apparatus.

The invention provides for the growing of material upon a substrate, particularly the growing of an epitaxial layer of semiconductor material upon a substrate. The layer is grown within a well containing the material in liquid phase. The invention further provides for the simultaneous sliding of numerous substrates into the well for the simultaneous growth of layers in the construction of multiple semiconductor devices simultaneously. The apparatus of the invention further provides for the sliding of the substrates from one well to another well for the growing of successive layers of semiconductor material in the simultaneous construction of the semiconductor devices. Also included within the apparatus of the invention is an assembly of reservoirs which allow for the heating of the semiconductor material to attain the requisite liquid phases, after which the assembly of reservoirs is moved relative to the set of wells for transference of the liquid-phase materials to the wells followed by a closure of the wells. This arrangement permits each step in the manufacturing process to be accomplished in an automatic fashion and with complete control of each of the individual steps without any necessity for removal of the semiconductor devices from the protected atmosphere of the apparatus wells, and without any interference of one manufacturing step upon another manufacturing step during construction of the semiconductor devices. Details in the construction of the apparatus will now be described further with reference to the drawing figures.

FIGS. 1-9 show a horizontal slider apparatus 20 of the invention, the apparatus 20 comprising a fixed well assembly 22, a bar assembly 24 which is slideably mounted within the well assembly 22, and a reservoir assembly 26 which is slideably mounted on top of the well assembly 22. The well assembly 22 comprises a set of melt wells 28 of which individual ones thereof are further identified by the legends 28A-E. The bar assembly 24 comprises a set of bars 30, individual ones of which are further identified by the legends 30A-E, the bars 30 being spaced apart by spacers 32 and secured by pins 34 which thread the bars 30 and the spacers 32 at opposite ends of the bars 30 to provide rigidity to the assembly 24. The reservoir assembly 26 comprises a set of melt reservoirs 36, individual ones of which are further identified by the legends 36A-G, which reservoirs are of different sizes and shapes, and wherein some of the reservoirs 36 are adapted for communication with respective ones of the wells 28 while other ones of the reservoirs 36 communicate only with adjacent ones of the reservoirs 36. Covers 38, individual ones of which are further identified by the legends 38A-E, cap the reservoirs 36. The cover 38C includes a channel 40 which provides communication between the reservoirs 36C and 36D. The cover 38E includes a channel 42 which provides communication between the reservoirs 36F and 36G.

Figure 2:
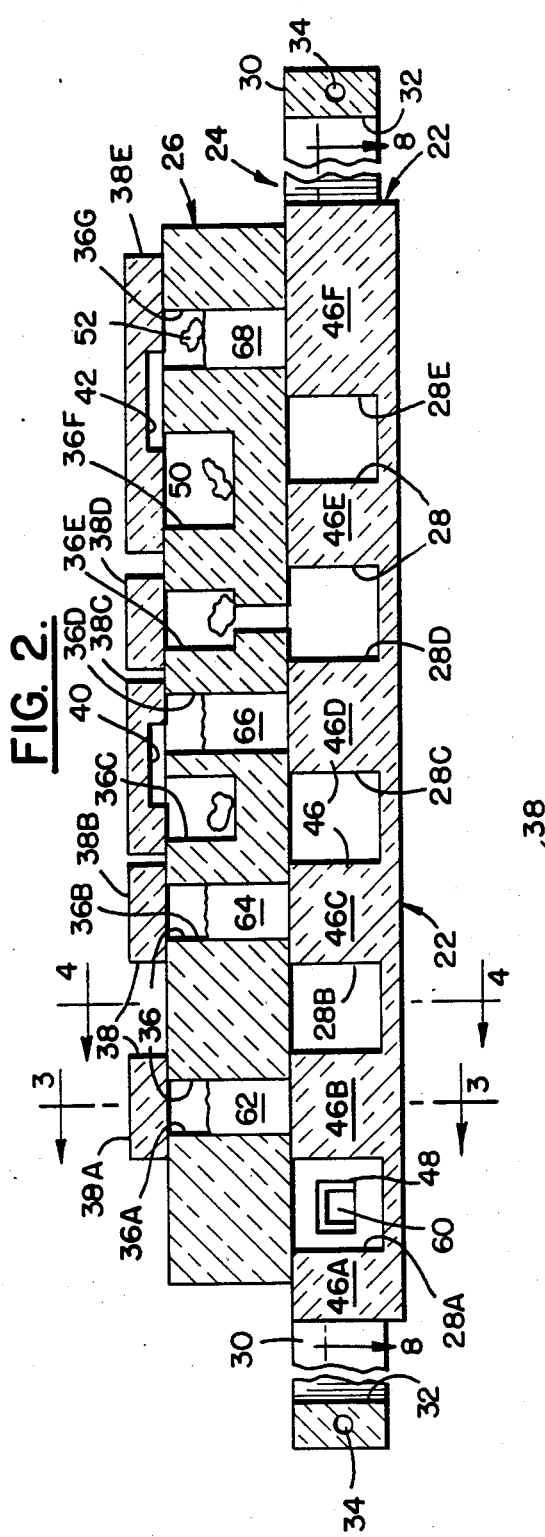
FIG. 2 is a longitudinal sectional view of the apparatus taken along the line 2—2 in FIG. 1.

In the position of the reservoir assembly 26 relative to the well assembly 22, as shown in FIG. 2, only the reservoir 36E is in communication with a well, this being the well 28D. Upon a sliding of the reservoir assembly 26 towards the left, the communication between the reservoir 36E and the well 28D is terminated, and communication is initiated between reservoir 38A and well 28A, between reservoir 38B and well 28B, between reservoir 36D and well 28C, and between reservoir 36G and well 28E. The bottoms of the reservoirs 36C and 36F are closed off so as to prevent direct communication between these reservoirs and any of the wells 28. The reservoir 36C serves the function of providing a requisite concentration of material via the channel 40 in the reservoir 36D. The reservoir 36F serves the function of providing a requisite concentration of material via channel 42 in the reservoir 36G. The covers 38 are opened for insertion of the desired materials in the respective reservoirs 36, and thereafter are closed to maintain the environments within the respective reservoirs 36 during heating and other steps of the manufacturing process.

Figure 4:
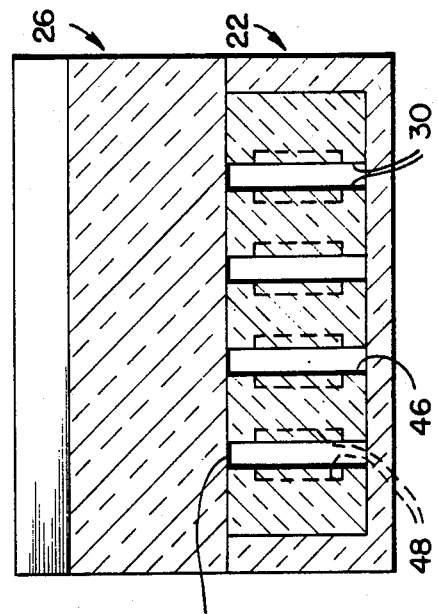
FIG. 4 is a transverse sectional view of the apparatus taken along the line 4—4 in FIG. 2.
Figure 3:
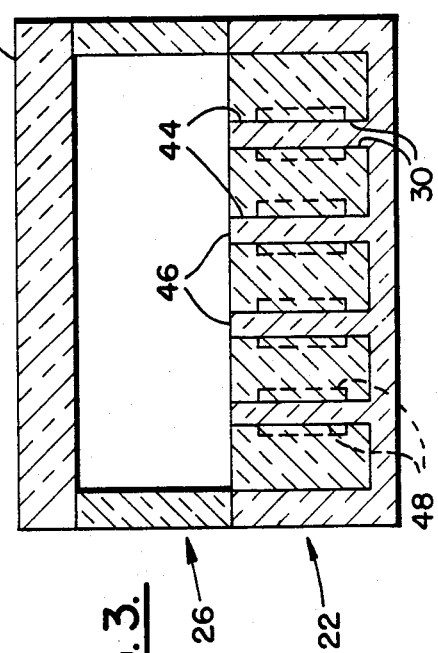
FIG. 3 is a transverse sectional view of the apparatus taken along the line 3—3 in FIG. 2.

The bars 30 are arranged side by side (FIG. 1), and as shown most clearly in FIGS. 3, 4, and 8, the bars 30 set within channels 44 of the well assembly 22. The channels 44 extend in a parallel array along the longitudinal axis of the well assembly 22 through transverse walls 46 of the well assembly 22, individual ones of the walls being further identified by the legends 46A-F. The channels 44 communicate between successive ones of the wells 28. However, the bars 30 make a sufficiently tight fit with sidewalls of the channels 44 so as to prevent the flow of liquid matter between neighboring wells 28.

As may be seen in FIGS. 3-7, the bars 30 contain recesses 48, each of which has sufficient depth and transverse dimensions to contain a fully grown semiconductor device. The longitudinal dimension of a recess 48 is less than the width of a transverse wall 46, as measured along the longitudinal axis of the well assembly 22, so as to ensure closure of a channel 44 during passage of a recess between neighboring wells 28 during a sliding movement of the bar assembly 24. In this way, a recess 48, with its semiconductor device in various stages of construction, is transported from one well 28 to the next well 28. The bars 30, the spacers 32, the pins 34, the well assembly 22 and the well assembly 34 are constructed of graphite which permits sliding contact between a bar 30 on the walls of a channel 44. Also, the graphite is a suitable material for containing a semiconductor substrate and the layers of material grown thereon without introducing any undesirable contamination of the semiconductor material during the fabrication of the semiconductor devices. The bars 30A and 30E on the exterior positions of the bar assembly 24 move along the outer sidewalls of the well assembly 22 while the other bars 30B, 30C, and 30D move through the central portion of each of the wells 28. Accordingly, the exterior bars 30A and 30E are provided with a single recess 48 (FIG. 7) disposed on the side of the bar 30 facing a center line of the well assembly 22, while the remaining bars 30B, 30C, and 30D are provided with recesses 48 (FIG. 6) on both sides of the bar 30. The bars 30 are oriented vertically, standing on their edges with the recesses 48 setting along the sides of the bars 30 so as to facilitate a loading of each of the wells 28 with the respective liquid-phase materials from the reservoirs 36.

Figure 10A:
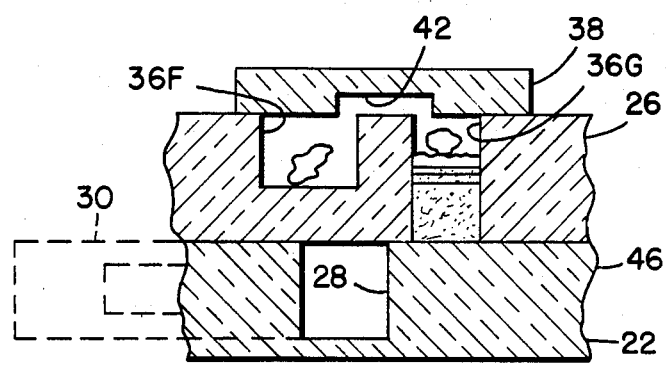
FIGS. 10A–10D show successive stages in the operation of the apparatus of FIG. 2.

Operation of the slider apparatus 20 can be explained with reference to FIGS. 10A-D which show diagrammatically the right hand portion of FIG. 1, disclosing four stages in the operation of the reservoirs 36F-G and the well 28E or alternatively, the reservoirs 36C-D coupled by channel 40 and the well 28C. By way of example, the apparatus 20 is assumed to be fabricating an infrared radiation detecting element composed of mercury-cadmium-telluride. With respect to the four stages of the operation, it is to be understood that this is not the complete operation in the fabrication of the detector, but represents only a part of the construction process. The reservoir 36F is loaded with HgTe which is shown as a pellet 50, the reservoir 36G contains a pellet 52 of CdTe r HgCdTe floating on top of a molten tellurium-rich solution, and the well 28E is initially empty (FIG. 10A). The apparatus 20 is enclosed within a furnace 54, partially shown in FIG. 1 for heating the apparatus 20 and the material contained within the reservoirs 36 and the wells 28 thereof. By way of example, the furnace 54 may be fabricated of a ceramic envelope 56 surrounded by an electrically operated heating coil 58 which, in turn, is applied with electric current from a well-known temperature controller.

Heat from the furnace 54 sublimes the HgTe pellet 50 in the reservoir 36, and also melts the material in the reservoir 36G to provide the molten tellurium-rich solution of CdTe or HgCdTe. A bar 30 carrying a substrate 60 in a recess 48 shown in FIG. 2 and also is indicated in phantom on the left side of FIGS. 10A-C. The substrate is used for growing layers of semiconductor material in the fabrication of the infrared detector.

Figure 10B:
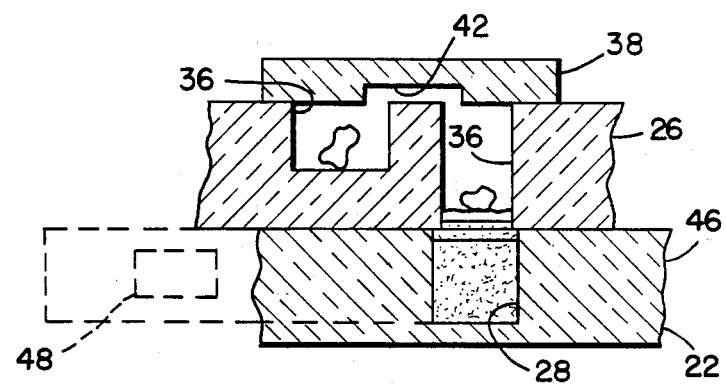

After completion of the heating in the materials in the reservoirs 36F and 36G, the reservoir assembly 26 is moved to the left to bring the reservoir 36G in communication with the well 28E. Thereupon, the solution flows from the reservoir 36G into the well 28E. The volume of the reservoir 36G is larger than the available volume of the well 28E so as to have excess capacity of the solution, thereby to ensure adequate filling of the well 28E. Also shown in both FIGS. 10A and 10B is the communication via the channel 42 whereby vapors of the subliming HgTe in the reservoir 36F pass into the reservoir 36G to be absorbed into the solution. This permits the materials of both of the pellets 50 and 52 to be separately heated while being allowed to contribute jointly to the contents of the solution.

As noted above, the apparatus 20 is constructed of graphite. The graphite has the requisite inert properties to prevent contamination of the semiconductor materials, and can also withstand temperatures up to 1000° C. In addition, the graphite can be accurately machined so as to provide the above noted close fit between the bars 30 and the channels 44 of the well assembly 22. Sliding of the bar assembly 24 and the reservoir assembly 26 within the furnace 54 is accomplished by means of quartz push rods (not shown) which extend out through seals in a wall of the furnace 54 which enable either manual or mechanical displacement of the bar assembly 24 and the reservoir assembly 26 to be made relative to the well assembly 22 without any contamination of the interior environment of the furnace 54.

The third stage in the operation (FIG. 10C) shows the reservoir assembly 26 moved further to the right to close off the well 28E. The reservoir 36G contains an oxide rich residual melt and saturation seed. The well 28E is filled with the confined melt, the melt being free of oxide and saturated.

Figure 10C:
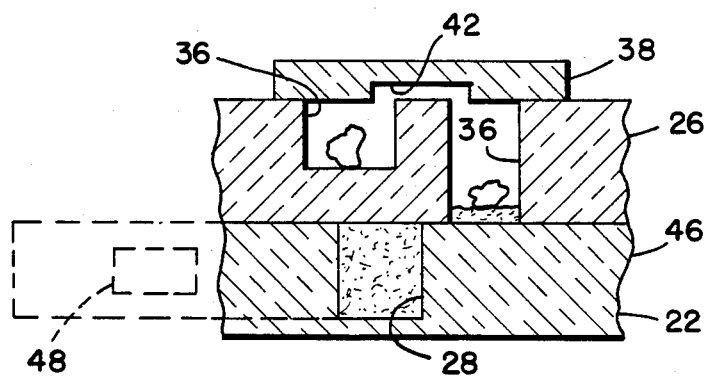
Figure 10D:
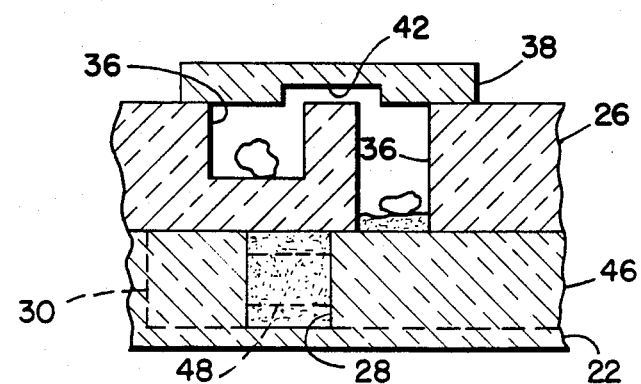

FIG. 10D shows the fourth stage in the operation wherein the bar 30 is slid to the right so as to place the recess 48 within the well 28. This permits the substrate 60 to contact the saturated solution for growing an epitaxial layer on the substrate. While the view of FIG. 10D shows only one substrate 60, it is understood that all five bars 30 have slid forward so as place eight of the substrates 60 simultaneously within the well 28E. Thereby, epitaxial layers are grown of the same material simultaneously on eight separate substrates. It is also noted that the close mechanical fit between the bottom surface of the reservoir assembly 26 and the top surface of the well assembly 22, and the close mechanical fit between the bar assembly 24 and the sidewalls of the channels 44 in the well assembly 22 allow the edges of these surfaces at the interfaces between the reservoirs 36 and the wells 28 to serve as wipers for clearing any excess liquid-phase material from the interface between the reservoir assembly 26 and the well assembly 22 as the two assemblies translate relative to each other. This provides for the proper sealing of the well 28E in the third stage of the operation as depicted in FIG. 10C. In this connection, it should be noted that the width of a transverse wall 46, as measured along the longitudinal axis of the apparatus 20, is to be larger than the corresponding dimension of a reservoir 36 so as to seal off the bottom of the reservoir 36G as shown in FIG. 10C. A similar comment applies to the longitudinl dimensions of corresponding wall regions of the reservoir assembly 26 so as to seal the top of the well 28E as shown in FIG. 10D.

As is shown in FIG. 11, the temperature provided by the furnace 54 is to be altered during various stages in the fabrication of a semiconductor device. At the left side of the graph, the temperature is relatively high to provide for saturation and homogenization of melts in the reservoirs 36. Thereupon, the temperature is lowered through the liquidus temperature of a growth solution to be maintained at a fixed temperature for isothermal growth (typically 490° C. for the HgCdTe material). The duration of the saturation temperature is approximately 1 hour while the duration of the growth time is at least approximately 10 minutes. Thereafter, the temperature is again lowered to terminate the growth of layers.

Upon review of the foregoing operation, it is appreciated that the apparatus 20 allows for in-situ successive growths of three or more epitaxial films upon individual substrates. One application of this growth technique is the in-situ deposition of an n-type capping layer of HgCdTe upon a base layer of p-type HgCdTe which, in turn, has been deposited upon a thin film of CdTe r ternary CdTe alloy. The substrate may be CdTe or an alloy with CdTe. In the foregoing four stages of an operational procedure, it is noted that an etching solution may be loaded into a well 28 from a reservoir 36 ffor in-situ surface etching of a substrate 60 prior to growing an epitaxial layer thereon. The etching process terminates when the bar assembly 24 advances the substrate away from the well containing the etchant.

It is also noted that by selection of the requisite operating temperature, a layer of material may be annealed in a mercury-rich atmosphere in order to establish the electrical properties of each deposited film.

The apparatus 20 prevents the evaporative loss of mercury from a melt solution during layer growth, and is capable of homogenizing and saturating the melts, as well as being capable of removing oxides which would otherwise inhibit proper epitaxial growth.

Excess melt found in the reservoirs 36 is readily discarded, the amount of the excess being minimal in view of the close matching of the size of the wells 28 and their respective reservoirs. In the use of crystalline CdTe or HgCdTe (FIGS. 10A-10D) by addition to the tellurium-rich solution prior to each run of the apparatus 20, the CdTe and HgCdTe serve as seed material which saturates the melts at a chosen temperature and floats on the surface of the molten solution. Epitaxial growth is initiated only after the excess CdTe is decanted out of the melt. Such decantation also removes most melt oxides which would otherwise inhibit proper melt supercooling. Epitaxial growth occurs isothermally from properly saturated, supercooled melt solutions. This control over melt characteristics helps to prevent substrate/layer melt-back and helps to ensure axial layer compositional uniformity. This is particularly useful in the fabrication of HgCdTe photovoltaic devices.

By way of example, in the construction of an HgCdTe photovoltavic detector, a CdTe substrate is employed. An etching solution 62 is provided in reservoir 36A. Reservoir 36B contains T-rich melt 64 for CdTe or CdTe alloy buffer layer deposition. P-type HgCdTe tellurium-rich melt 66 is located in reservoir 36D; and n-type HgCdTe tellurium-rich melt 68 is located in reservoir 36G.

A typical procedure for the deposition of three films upon eight substrates (or more substrates if additional recesses and/or bars are employed) substrates is as follows:

1. Elemental Te crystals are added to reservoir 36A.
2. Ingots of Te-rich growth material which have been purified, homogenized, and cast into ingot form are used as source material. Approximately 12 grams of the appropriate source material is added to reservoirs 36B, 36D, and 36G.
3. Crystals of HgTe, wherein the relative portion of the mercury and tellurium has been selected as may be desired, are added to the reservoirs 36C, 36E, and 36F.
4. Substrates of CdTe are positioned and mounted in the recesses of the bars 30.
5. Crystals of CdTe or bulk HgCdTe of the appropriate composition are placed into reservoirs 36D and 36G.
6. The reservoirs are capped and the assembly is placed within the furnace at a temperature slightly above the liquidus temperature of the melt solutions as shown in the graph of FIG. 11.
7. The temperature is maintained at the saturation temperature for an amount of time appropriate to assure thorough homogenization of the melt which has been saturated by contact with either the CdTe or HgCdTe. During this time, subliming HgCdTe provides a source of Hg overpressure, thereby preventing the evaporative loss from the Te-rich melts.
8. After an appropriate time, the reservoir assembly 26 is slid along the well assembly 22, and the melts completely fill the respective wells. Since the available volume of a well 28 is smaller than that of the corresponding reservoir 36, approximately 25% of the melt is decanted by sliding the reservoir assembly 26 back to its original position. Both the excess saturation CdTe or HgCdTe and any melt oxides that have floated to the surface are thereby decanted. The wells 28 therefore contain thoroughly saturated oxide-free melts that have been further homogenized by the decantation and mixing associated with the relative motion between the reservoir assembly 26 and the well assembly 22.
9. The assembly is then cooled to a temperature below the liquidus temperature (FIG. 11), namely to a fixed temperature suitable for growing epitaxial layers.
10. Substrate etching is initiated by sliding the substrates 60 into the first well 28A for a relatively short time, sufficient to provide a desired degree of surface etch. After the interval of surface etch, the substrates are advanced through further ones of the wells 28 sequentially to provide for growths of the CdTe buffer film, p-type HgCdTe, and n-type HgCdTe. The melts are decanted by use of the aforementioned wiping action, or by wipers (not shown) disposed on the well assembly 22.
11. In-situ annealing may be done, if desired, in well 28D which is in contact with a source of mercury at reservoir 36E.
12. Following growth, the apparatus 20 is cooled (FIG. 11) to ambient temperature, and the completed semiconductor wafers are unloaded.

This completes the example of fabrication of the mercury-cadmium-telluride photovoltaic detector elements. It is to be understood that the foregoing usage of the apparatus 20 is also applicable to other semiconductor materials for fabrication of other semiconductor devices.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

I claim:

1. Slider apparatus for constructing laminated structures including multiple-layer semiconductor devices comprising:
   a well assembly including a plurality of melt wells interconnected by a set of parallel channels;
   a bar assembly including a set of bars slideably mounted within respective ones of said channels of said well assembly, each bar having a recess for holding a substrate of a device to be constructed by said apparatus;
   a reservoir assembly slideably disposed alongside of said well assembly and including a plurality of reservoirs for holding individual melts and other reagents to allow heating of the melts upon a positioning of said reservoir assembly in a first position relative to said well assembly, said reservoirs being arranged for transferring individual melts from the reservoirs to corresponding ones of the wells upon a positioning of said reservoir assembly in a second position in registration with said melt assembly; and wherein
   said plurality of melt reservoirs includes a group of said reservoirs and a further reservoir, reservoirs of said group being arranged in alignment with said wells to permit said transferring of said individual melts, said further reservoir being offset in position from the alignment of said group to restrain transference of a reagent of said further reservoir until a further positioning of said reservoir assembly relative to said well assembly;
   a sequential movement of said reservoir assembly relative to said well, assembly provides for a sequential application of reagents carried by said group of reservoirs and by said further reservoir to substrates carried by bars through said wells; and
   a sequential movement of the substrates by said bars along said channels to successive ones of said wells permits successive layers of the respective melt materials to be grown upon each of the substrates, thereby to construct simultaneously a plurality of the devices.

2. Slider apparatus for constructing multiple layer semiconductor devices according to claim 1 wherein said reservoir assembly is located above said well assembly to allow for gravity feed of material from reservoirs of said reservoir assembly into wells of said well assembly, each of said assemblies being fabricated of graphite for maintaining purity of compositions of semiconductor materials constructed within said apparatus, and wherein said bar assembly and said reservoir assembly are slideable each in a horizontal direction relative to said well assembly.

3. Slider apparatus according to claim 2 wherein said apparatus is operable with a furnace providing plural values of temperature, a first one of said temperatures being above a liquidus temperature of materials held within said apparatus and being applied when said reservoir assembly is in said first position, and a second of said temperatures being lower than said liquidus temperature and being provided when said reservoir assembly is in said second position; and wherein said first temperature is high enough to melt material held within said apparatus to provide for solutions of such materials;

said second temperature is of a value suitable for growing said layers; at least two of said layers are layers of semiconductor materials;

said apparatus provides for the growing of one of said two layers upon the other of said two layers by epitaxial growth; and wherein the advancement of a substrate by said bar assembly from one well of said well assembly to another well of said well assembly in an elevated temperature environment provided by said furnace initiates an annealing of one of said layers to another of said layers.

4. Slider apparatus according to claim 3 wherein a crystal is carried by a reservoir of said reservoir assembly, which reservoir is offset from a reservoir carrying a melt and transmits vapor of said crystal into a well of said well assembly for annealing material carried by said bar assembly into said well having said vapor, the offsetting of the vapor-carrying reservoir relative to a melt-carrying reservoir allowing for application of the vapor at a time different from a time of transference of a plurality of melts to a plurality of wells.

5. Slider apparatus according to claim 2 wherein a substrate carried by a bar of said bar assembly is composed of cadmium telluride, and wherein a melt held within one reservoir of said reservoir assembly is composed of mercury-cadmium-telluride, and wherein a second reservoir of said reservoir assembly holds a pellet of mercury-telluride, said apparatus further comprising means for communicating vapor from said mercury-telluride pellet in said second reservoir to a solution of said mercury-cadmium-telluride in said one reservoir.

6. Slider apparatus according to claim 1 further comprising cover means for capping each of said reservoirs after emplacement of material in each of said reservoirs, thereby to maintain an atmosphere in each of said reservoirs.

7. Slider apparatus according to claim 6 further comprising means for heating material held by said apparatus to a sufficient temperature to liquify such material, and wherein at least one of said reservoirs of said reservoir assembly is large enough to hold both liquified material plus a seed ingot for maintaining a rich concentration of material of said seed ingot in liquid held by said reservoir.

8. Slider apparatus according to claim 7 wherein said capping means is provided with channels coupling two neighboring ones of said reservoirs, thereby enabling vapors produced by material in one of said neighboring reservoirs in response to heating by said heating means to be communicated to a second of said neighboring reservoirs for maintaining a rich solution in said second of said neighboring reservoirs of the material of said first of said neighboring reservoirs.

9. Slider apparatus according to claim 1 wherein bars of said bar assembly are disposed upstanding on edges thereof, and wherein the recesses of said bars are disposed along vertically oriented surfaces of respective ones of said bars, thereby to permit a uniform filling of wells of said well assembly with melts from reservoirs of said reservoir assembly, said reservoir assembly being located above said well assembly to allow melts to flow down upon bars of said bar assembly located within wells of said well assembly.

10. Slider apparatus according to claim 9 wherein said reservoir assembly is located above said well assembly to allow for gravity feed of material from reservoirs of said reservoir assembly into wells of said well assembly, each of said assemblies being fabricated of graphite for maintaining purity of compositions of semiconductor materials constructed within said apparatus, and wherein said bar assembly and said reservoir assembly are slideable each in a horizontal direction relative to said well assembly; and wherein edges of wells of said well assembly are structured to serve as wipers of material supplied by reservoirs of said reservoir assembly to ensure accurate filling of a well of said well assembly with material from a reservoir of said reservoir assembly.

* * * * *